US012057273B2

(12) United States Patent
Li et al.

(10) Patent No.: US 12,057,273 B2
(45) Date of Patent: Aug. 6, 2024

(54) METHOD FOR PREPARING INORGANIC PEROVSKITE BATTERY BASED ON SYNERGISTIC EFFECT OF GRADIENT ANNEALING AND ANTISOLVENT, AND PREPARED INORGANIC PEROVSKITE BATTERY

(71) Applicant: SOOCHOW UNIVERSITY, Suzhou (CN)

(72) Inventors: Yaowen Li, Suzhou (CN); Weijie Chen, Suzhou (CN); Yonfang Li, Suzhou (CN)

(73) Assignee: SOOCHOW UNIVERSITY, Suzhou (CN)

( * ) Notice: Subject to any disclaimer, the term of this patent is extended or adjusted under 35 U.S.C. 154(b) by 771 days.

(21) Appl. No.: 17/170,062

(22) Filed: Feb. 8, 2021

(65) Prior Publication Data
US 2021/0166885 A1    Jun. 3, 2021

Related U.S. Application Data

(63) Continuation of application No. PCT/CN2018/099716, filed on Aug. 9, 2018.

(51) Int. Cl.
*H01G 9/00* (2006.01)
*H01G 9/20* (2006.01)
(Continued)

(52) U.S. Cl.
CPC ......... *H01G 9/0036* (2013.01); *H01G 9/2009* (2013.01); *H01G 9/2018* (2013.01);
(Continued)

(58) Field of Classification Search
CPC ...................................................... H01L 31/18
See application file for complete search history.

(56) References Cited

U.S. PATENT DOCUMENTS

2018/0366539 A1\*   12/2018   Ergen .................... B01J 23/002

FOREIGN PATENT DOCUMENTS

| CN | 105070841 A | 11/2015 |
|---|---|---|
| CN | 107528002 A | 12/2017 |

OTHER PUBLICATIONS

Dou, et al., Chemistry of Materials, 2017, 29, 5931-5941 (Year: 2017).\*

(Continued)

*Primary Examiner* — Sadie White
(74) *Attorney, Agent, or Firm* — SZDC Law PC

(57) ABSTRACT

A method for preparing an inorganic perovskite battery based on a synergistic effect of gradient annealing and antisolvent includes preparing a perovskite layer by a gradient annealing and an antisolvent treatment. A thickness of the perovskite layer is 100 to 1000 nm; when preparing a perovskite precursor solution of the perovskite layer, a solvent is an amide-based solvent and/or a sulfone-based solvent; a concentration of the perovskite precursor solution for preparing the perovskite layer is 0.4 to 2 M; and the gradient annealing is conducted at 40 to 70° C./0.5 to 5 min+70 to 130° C./0.5 to 5 min+130 to 160° C./5 to 20 min+160 to 280° C./0 to 20 min; and a solvent for the anti-solvent treatment is an alcohol solvent, a benzene solvent or an ether solvent.

5 Claims, 8 Drawing Sheets

FIG. 12

(51) Int. Cl.
  *H01L 31/18* (2006.01)
  *H01M 4/00* (2006.01)
  *H01M 4/90* (2006.01)
  *H10K 30/30* (2023.01)
  *H10K 30/82* (2023.01)
  *H10K 71/15* (2023.01)
  *H10K 71/40* (2023.01)
  *H10K 102/10* (2023.01)

(52) U.S. Cl.
  CPC ........... *H01G 9/2027* (2013.01); *H01L 31/18* (2013.01); *H01M 4/00* (2013.01); *H01M 4/9033* (2013.01); *H10K 30/30* (2023.02); *H10K 30/82* (2023.02); *H10K 71/15* (2023.02); *H10K 71/441* (2023.02); *H10K 2102/102* (2023.02); *H10K 2102/103* (2023.02)

(56) References Cited

OTHER PUBLICATIONS

Supplemental information for Dou, et al., Chemistry of Materials, 2017, 29, 5931-5941 (Year: 2017).*
Shargaieva, et al., ACS Applied Materials and Interfaces, 2017, 9, 38428-384 (Year: 2017).*
Yang, et al. (ACS Applied Materials and Interfaces, 2017, 9, 23141-23151) (Year: 2017).*

* cited by examiner

METHOD FOR PREPARING INORGANIC PEROVSKITE BATTERY BASED ON SYNERGISTIC EFFECT OF GRADIENT ANNEALING AND ANTISOLVENT, AND PREPARED INORGANIC PEROVSKITE BATTERY

This application is a Continuation Application of PCT/CN2018/099716, filed on Aug. 9, 2018, which is incorporated by reference for all purposes as if fully set forth herein.

TECHNICAL FIELD

The invention relates to a solar cell, in particular to an all-inorganic perovskite solar cell and a preparation method thereof, and a method for preparing an inorganic perovskite battery based on the synergistic effect of gradient annealing and antisolvent, and the prepared inorganic perovskite battery.

BACKGROUND TECHNIQUE

Inorganic perovskite solar cells use a laminated structure, placing the inorganic perovskite active layer between the electron transport layer and the hole transport layer, avoiding the direct contact of perovskite with the anode and the cathode to reduce the solar energy conversion efficiency. Generally, small organic molecules or polymers are used as the material of the hole transport layer, and metal oxides are used as the material of the electron transport layer. The film formation quality of the perovskite active layer plays a vital role in the photoelectric conversion efficiency of solar cells. At present, the main method for preparing inorganic perovskites is solution film formation. The solution film formation method generally requires an antisolvent to accelerate the precipitation of crystals. To accelerate the growth of crystals; the currently used anti-solvents are usually toxic solvents such as chlorobenzene and chloroform, not green solvents, which will have a great impact on the environment; in addition, small grains in inorganic perovskite films and the porous morphology will reduce the overall performance of the battery.

Technical Problem

The purpose of the present invention is to provide an all-inorganic perovskite solar cell and a method for preparing the same. The method of gradient annealing and green antisolvent is used to effectively improve the photoelectric conversion efficiency of the solar cell. The entire cell preparation process does not require high-temperature calcination and has high repeatability. Easy to operate.

Technical Solutions

The present invention adopts the following technical solutions:

A method for preparing an inorganic perovskite battery based on the synergistic effect of gradient annealing and an antisolvent, and a method of preparing a perovskite layer by a method of gradient annealing and antisolvent treatment.

In the present invention, the thickness of the perovskite layer is 100 to 1000 nm; in the perovskite precursor solution for preparing the perovskite layer, the solvent is an amide solvent and/or a sulfone solvent, preferably DMF and/or DMSO, and more preferably DMSO; the concentration of the perovskite precursor solution for preparing the perovskite layer is 0.4 to 2M, preferably 1 to 1.8 M; the gradient annealing process is 40 to 70° C./0.5 to 5 min+70 to 130° C./0.5 to 5 min+130 to 160° C./5 to 20 min+160 to 280° C./0 to 20 min, preferably, the gradient annealing process is 40 to 60° C./1 to 2 min+80 to 120° C./1 to 2 min+150 to 180° C./5 to 15 min+180 to 200° C./O to 2 min; the anti-solvent is alcohol solvent, benzene solvent or ether solvent; when preparing the perovskite layer, the spin coating speed is 2500 to 3500 rpm, and the time is 25-45 seconds. In the prior art, in order to obtain a high-quality thin film, a precursor solution with a lower concentration (less than 0.8 M) and a mixed solvent containing a large amount of DMF are generally used. However, in order to obtain a film thickness close to 300 nm, the existing method is generally accompanied by Low rotation speed, less than 1500 rpm, so there is no guarantee of film formation quality; the present invention uses pure DMSO as a solvent to ensure a high concentration precursor solution. After high-speed spin coating (3000 rpm), a high-quality film (surface flatness) is obtained Uniformity, good stability, good repeatability, and fewer defects), and the film thickness can reach 500 nm, which has achieved unexpected technical effects.

In the present invention, the perovskite layer is an all-inorganic $CsPbXSn_{1-x}IyBr_{3-y}$, where $0 \leq y \leq 3$, $0 \leq x \leq 1$; or $Cs_aK_bRb_{1-a-b}Pb_cSndCa_eMg_{1-c-d-e}IyBr_{3-y}$, where $0 \leq a \leq 1$, $0 \leq b \leq 1$, $0 \leq c \leq 1$, $0 \leq d \leq 1$, $0 \leq e \leq 1$, $a+b=1$, $c+d+e=1$, $0 \leq y \leq 3$; or CuInGaSn, CsAgBiI (Br), $Cs_xFAyMA_{1-x-y}PbIzBr_{3-z}$, where $0 \leq x \leq 1$, $0 \leq y \leq 1$, $x+y \leq 1$, $0 \leq z \leq 3$.

The invention adopts the method of gradient annealing and green antisolvent for the first time to prepare an inorganic perovskite layer on the electron (hole) transport layer. The prepared inorganic perovskite active layer has a flat and uniform surface, large grains, and few grain boundaries. Good stability and reproducibility, no need for toxic solvents; especially the inorganic perovskite prepared by the present invention has extremely strong crystalline strength, which makes the perovskite molecular orientation extremely high and the film quality high. High photoelectric conversion efficiency.

The method for preparing an inorganic perovskite battery based on the synergistic effect of gradient annealing and antisolvent according to the present invention specifically includes the following steps:
(1) Preparing a cathode on a transparent substrate;
(2) Preparing an electron transport layer on the cathode;
(3) Preparing the perovskite layer on the electron transport layer by gradient annealing and anti-solvent treatment;
(4) Preparing a hole transporting layer on the perovskite layer;
(5) Preparing an electrode on the hole transport layer to obtain the perovskite solar cell;

The obtained cell is an n-i-p battery;
or
(1) Preparing an anode on the transparent substrate;
(2) Preparing a hole transport layer on the anode;
(3) Preparing the perovskite layer on the hole transport layer by gradient annealing and anti-solvent treatment;
(4) Preparing an electron transport layer on the perovskite layer;
(5) Preparing an electrode on the electron transport layer to obtain a perovskite solar cell;

The obtained cell is a p-i-n type battery.

A method for preparing a perovskite thin film for an inorganic perovskite battery includes the following steps:
(1) Preparing a cathode on a transparent substrate;
(2) Preparing an electron transport layer on the cathode;

(3) Preparing the thin perovskite film on the electron transport layer by gradient annealing and antisolvent treatment;

or (1) Preparing an anode on the transparent substrate;
(2) Preparing a hole transport layer on the anode;
(3) Preparing the perovskite thin film on the hole transport layer by gradient annealing and antisolvent treatment.

The inorganic perovskite thin film prepared by the gradient annealing and the green anti-solvent method of the present invention has greatly improved the film formation uniformity and flatness, and the efficiency and stability of the device have been further improved. Wide band gap inorganic perovskite battery (680 nm absorption edge) not only guarantees high photoelectric conversion efficiency, but also provides important help for the development of translucent batteries and laminated batteries.

In the present invention, the transparent substrate is selected from the group consisting of a glass substrate, a quartz substrate, a PET plastic substrate, a PEN plastic substrate, and a flexible grid silver substrate; the cathode is indium tin oxide or fluorine-doped tin dioxide; the anode is indium tin oxide or fluorine-doped tin dioxide; the cathode or anode is prepared on a transparent substrate by a magnetron sputtering method; the material of the electron transport layer is one or more selected from the group consisting of ZnO, $TiO_2$, $SnO_2$, PCBM, fullerene, and or a fullerene derivative; the material of the hole transport layer is selected from the group consisting of poly[bis(4-phenyl)(2,4,6-trimethylphenyl)amine], poly3,4-ethylenedioxythiophene/polystyrene sulfonate, nickel oxide, copper oxide, 2,2',7,7'-tetra[N,N-bis(4-methoxyphenyl)amino]-9,9'-spirobi-fluorene, cuprous thiocyanate, and molybdenum oxide.

In the present invention, a conductive glass plated with an indium tin oxide film, commonly known as ITO, can be used as the cathode/anode of the battery; a fluorine-doped $SnO_2$ conductive glass, commonly known as FTO, can be used as the cathode/anode.

In the above technical solution, in step (2), the electron transport layer in the n-i-p structure is a metal oxide, such as ZnO, $TiO_2$, $SnO_2$ or a metal oxide composite transport layer, fullerene and a fullerene derivative, such as PCBM and C60, an organic-inorganic hybrid electron-transporting layer. An electron-transporting layer is prepared on the cathode by annealing after spin coating, the spin coating speed is 1000 to 5000 rpm, and the time is 10 to 60 seconds, the thickness is 10 to 100 nm, the annealing temperature is 100 to 300° C., and the time is 10 to 60 min. The p-i-n type hole transport layer is selected from the group consisting of a triphenylamine structure, such as poly [bis (4-phenyl) (2,4,6-trimethylphenyl) amine] and poly3,4-ethylen, a combination of p-type semiconductors, such as dioxythiophene/polystyrene sulfonate and organic salts, and a metal oxide, such as nickel oxide and copper oxide. A hole-transporting layer is prepared on the perovskite layer by a spin coating method, the speed of the spin coating is 1000 to 6000 rpm, the time is 20 to 60 s, and the thickness is 5 to 200 nm.

The hole transport layer of the p-i-n structure is selected from the group consisting of poly[bis(4-phenyl)(2,4,6)-trimethylphenyl)amine] and other polymers with a triphenylamine structure, a combination of p-type semiconductors, such as poly3,4-ethylenedioxythiophene/polystyrene sulfonate and organic salts, nickel oxide, copper oxide. A spin-coating method is used to prepare a hole transport layer on the anode, the spin-coating speed is 1000 to 6000 rpm, the time is 20 to 60 s, and the thickness is 5 to 200 nm.

In the above technical solution, in step (4), the hole transporting layer of the n-i-p type structure is selected from the group consisting of 2,2',7,7'-tetrakis[N,N-bis(4-methoxyphenyl)amino]-9,9'-spirobifluorene-based small molecules, poly [bis (4-phenyl) (2,4,6-trimethylphenyl) amine] and other triphenylamine structural compounds, cuprous thiocyanate, and a metal oxide, such as nickel, copper oxide, and molybdenum oxide. A hole transport layer is prepared on the perovskite layer by a spin coating method, the spin coating speed is 1000 to 6000 rpm, the time is 20 to 60 s, and the thickness is 50 to 300 nm. The electron-transporting layer described in the p-i-n-type structure includes a metal oxide, such as ZnO, a fullerene and a fullerene derivative, such as PCBM, and composite electron-transporting layers of inorganic oxides and organics. The spin-coating method is used to prepare an electron transport layer on the anode. The spin-coating speed is 1000 to 5000 rpm, the time is 10 to 60 s, the thickness is 10 to 100 nm, the annealing temperature is 100 to 300° C., and the time is 10 to 60 min. The electron transport layer described in the p-i-n structure includes a metal oxide, such as ZnO, a fullerene or a fullerene derivative, such as PCBM, and a composite electron transport layer of inorganic oxides and organics. The spin-coating method is used to prepare an electron transport layer on the perovskite layer. The spin-coating speed is 1000 to 5000 rpm, the time is 10 to 60 s, the thickness is 10 to 100 nm, the annealing temperature is 100 to 300° C., and the time is 10-60 min.

In the present invention, the electrode is one or more selected from the group consisting of an Au electrode, an Ag electrode, an Al electrode, a Cu electrode, a carbon electrode, a PH1000 polymer electrode, and a metal oxide electrode.

In the above technical solution, in step (5), an electrode is prepared on the hole (or electron) transport layer by a method of evaporation or transfer; the thickness of the electrode is 10 to 200 nm; and the electrode is a highly conductive metal electrode: e.g, an Au electrode, an Ag electrode, an Al electrode, a Cu electrode; a composite metal electrode; a carbon electrode; a polymer electrode: e.g., PH1000; or a metal oxide electrode.

An inorganic perovskite battery or a perovskite thin film for an inorganic perovskite battery prepared according to the above preparation method.

Application of the above perovskite thin film for an inorganic perovskite battery in preparing an inorganic perovskite battery.

The perovskite solar cell of the invention has the advantages of high efficiency, low cost, and convenient preparation. At the same time, the perovskite material has better light absorption, longer carrier transmission distance, weaker exciton binding energy. The characteristics of few surface defects make it a very competitive material, which has a broad application prospect in the field of batteries and luminescence.

Compared with the traditional organic-inorganic hybrid perovskite film, the all-inorganic perovskite film disclosed in the present invention has a qualitative improvement in thermal stability, and the inorganic perovskite film does not decompose at about 300° C. Solve the essential problem of thermal decomposition of organic-inorganic hybrid perovskite thin film components; high-quality inorganic thin films coupled with a wide band gap (680 nm absorption edge) make the entire cell translucent while ensuring high photoelectric conversion efficiency. The development of batteries and laminated batteries has provided important help. In combination with organic solar cells, perovskite batteries, silicon batteries, and CIGS batteries, the efficiency of laminated batteries can be effectively improved. In addition, high-quality perovskite films are used in the LED field and has a broad application prospect. With the addition of a forward voltage, single-molecule recombination can be effectively suppressed due to the fewer defect states of the thin film, which makes the injected electrons and holes more susceptible to radiative recombination and improves the red light emission efficiency.

Beneficial Effect

1. In the present invention, the perovskite layer is prepared by using gradient annealing and an anti-solvent method. The surface of the obtained perovskite layer film is even, stable, repeatable, has fewer defects, and has high photoelectric conversion efficiency; and high-quality inorganic perovskite mineral films also have good application prospects in the LED field;
2. The invention uses a green anti-solvent, abandons the traditional toxic anti-solvent, and effectively reduces environmental pollution;
3. The wide band gap inorganic perovskite solar cell prepared by the present invention has a wide band gap, has a very high utilization rate of light before 680 nm, and its narrow absorption is expected to be used as a bottom battery for a laminated battery, improving the photoelectricity of the laminated battery and conversion efficiency;

The above description is only an overview of the technical solutions of the present invention. In order to understand the technical means of the present invention more clearly and to be implemented according to the contents of the description, the following describes in detail the preferred embodiments of the present invention and the accompanying drawings. Specific embodiments of the present invention are given in detail by the following examples and their drawings.

EMBODIMENTS OF THE INVENTION

The present invention will be described in detail with reference to the following embodiments:

Example 1

Figure 1:
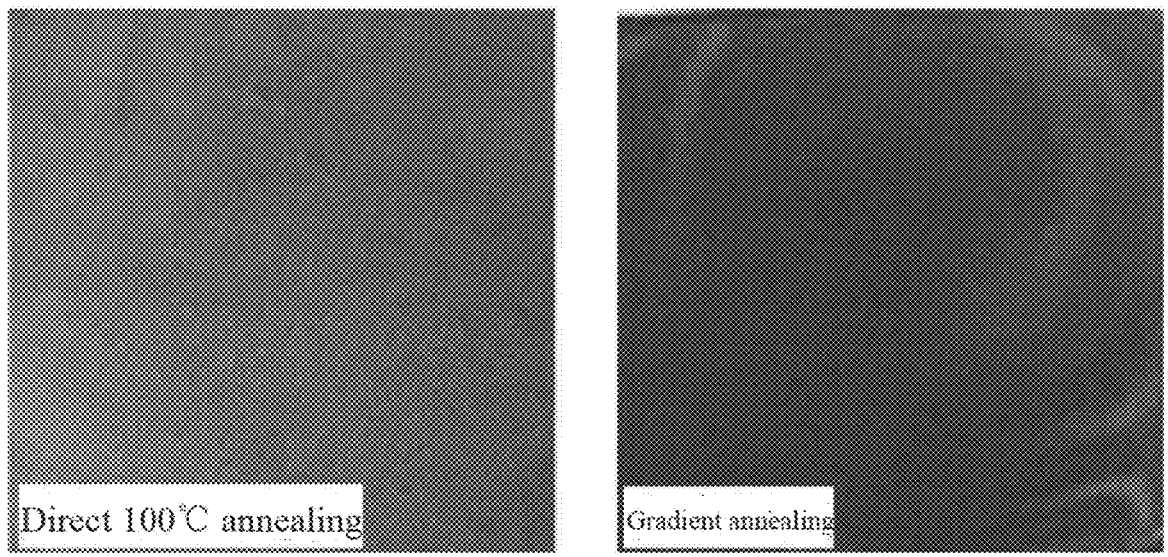
FIG. 1 is a photo of direct high temperature annealing and gradient annealing of $CsPbI_2Br$ in Example 1.
Figure 2:
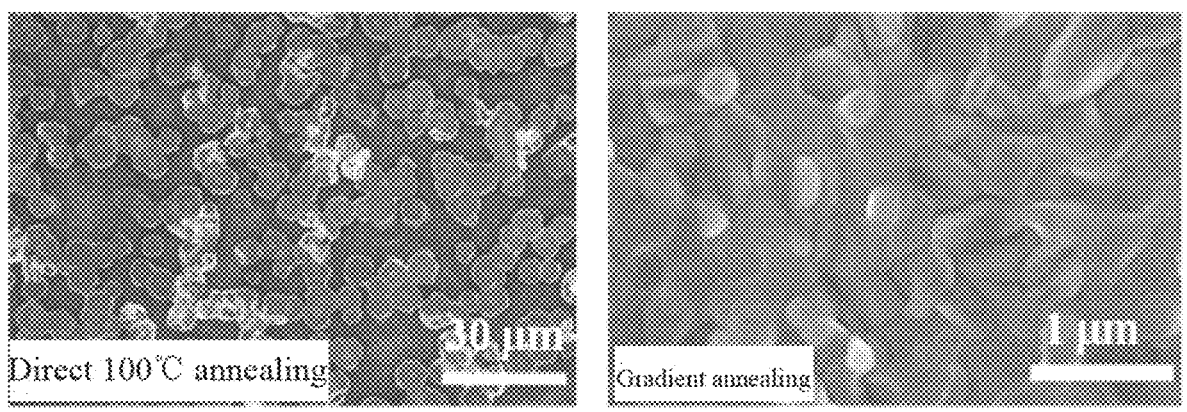
FIG. 2 is a SEM image of $CsPbI_2Br$ direct high temperature annealing and gradient annealing in Example 1.

(1) A rigid substrate of glass was used for polishing, and then a layer of indium tin oxide film was plated on the glass by a magnetron sputtering method to form an ITO conductive glass as a cathode of a solar cell;

(2) Spin-coating $TiO_2$ solution on ITO conductive glass, 3000 rpm 30 s, and then annealed at 150° C. for 30 min to obtain an electron transport layer with a thickness of 20 nm;

(3) The ITO spin-coated with the electron transport layer was placed in a nitrogen glove box and spin-coated with a perovskite precursor solution. The composition of the solution was $PbI_2$, CsI, and $PbBr_2$, and the composition concentration was 1.3 M $CsPbI_2Br$ solution; the solvent was pure DMSO; the precursor solution was stirred for two hours and filtered and ready for use; the spin coating speed was 3000 rpm and the time is 30 s. After the spin coating was completed, a gradient annealing was performed, first annealing at 50° C. for 1 minute, then annealing at 100° C. for 1 minute, and finally annealing at 160° C. for 10 minutes to obtain an inorganic perovskite film; compared with a one-step annealing process; FIG. 1 shows a direct one-step high-temperature annealing (160° C./10 min or 100° C./12 min) and a gradient annealing (50° C./1 min+100) ° C./1 min+160° C./10 min). It can be seen from the figure that the surface of the film directly annealed at high temperature is very rough, while the surface of the gradient annealed film is smooth, which illustrates the importance of gradient annealing to improve the quality of the film;

FIG. 2 is a scanning electron microscope (SEM) image of an inorganic perovskite thin film directly subjected to one-step high-temperature annealing and gradient annealing. As can be seen from the figure, the film coverage of direct high-temperature annealing is low, while the film coverage of gradient annealing is high and has good film formation;

(4) The obtained perovskite film was placed on a vacuum chuck and spin-coated with Spiro-OMeTAD (2,2',7,7'-tetra[N,N-bis(4-methoxyphenyl)amino]-9,9'-spirobifluorene) as a hole-transporting layer, rotating at 3000 rpm for 30 seconds, and then oxidizing in dry air for 12 hours to obtain a hole-transporting layer having a thickness of 150 nm;

(5) The oxidized hole-transporting layer was placed in a coating machine to deposit an Au electrode with a thickness of 80 nm.

Figure 3:
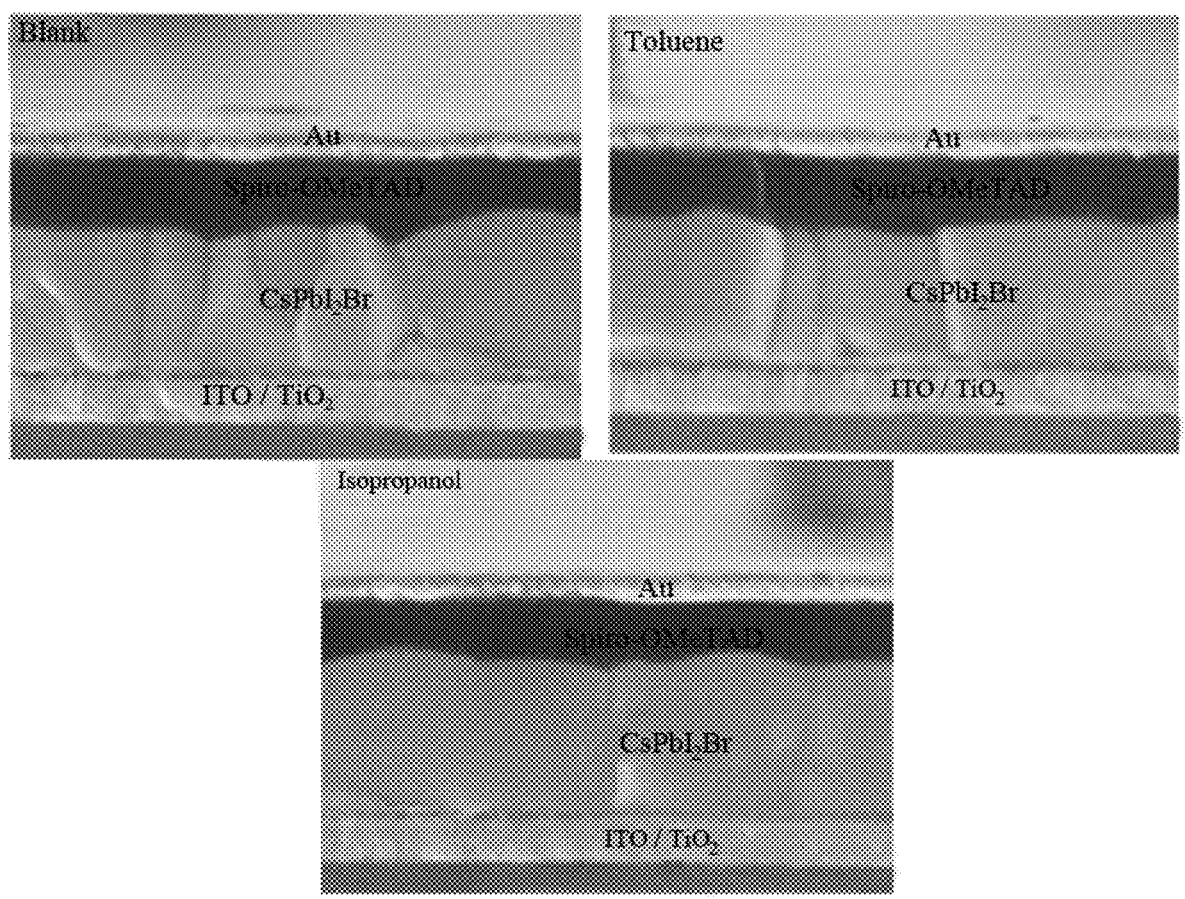
FIG. 3 is a SEM cross-sectional view of a $CsPbI_2Br$ perovskite layer in Example 1, which is Glass/ITO/$TiO_2$/$CsPbI_2Br$/Spiro-OMeTAD/Au from bottom to top.

At this point, the preparation of the $CsPbI_2Br$ perovskite battery is completed. The structure is shown in FIG. 3. The blank indicates no antisolvent treatment, and toluene and isopropanol indicate that they have been treated with toluene and isopropanol, respectively. It can be seen that a perovskite film thickness of 500 nm.

Figure 4:
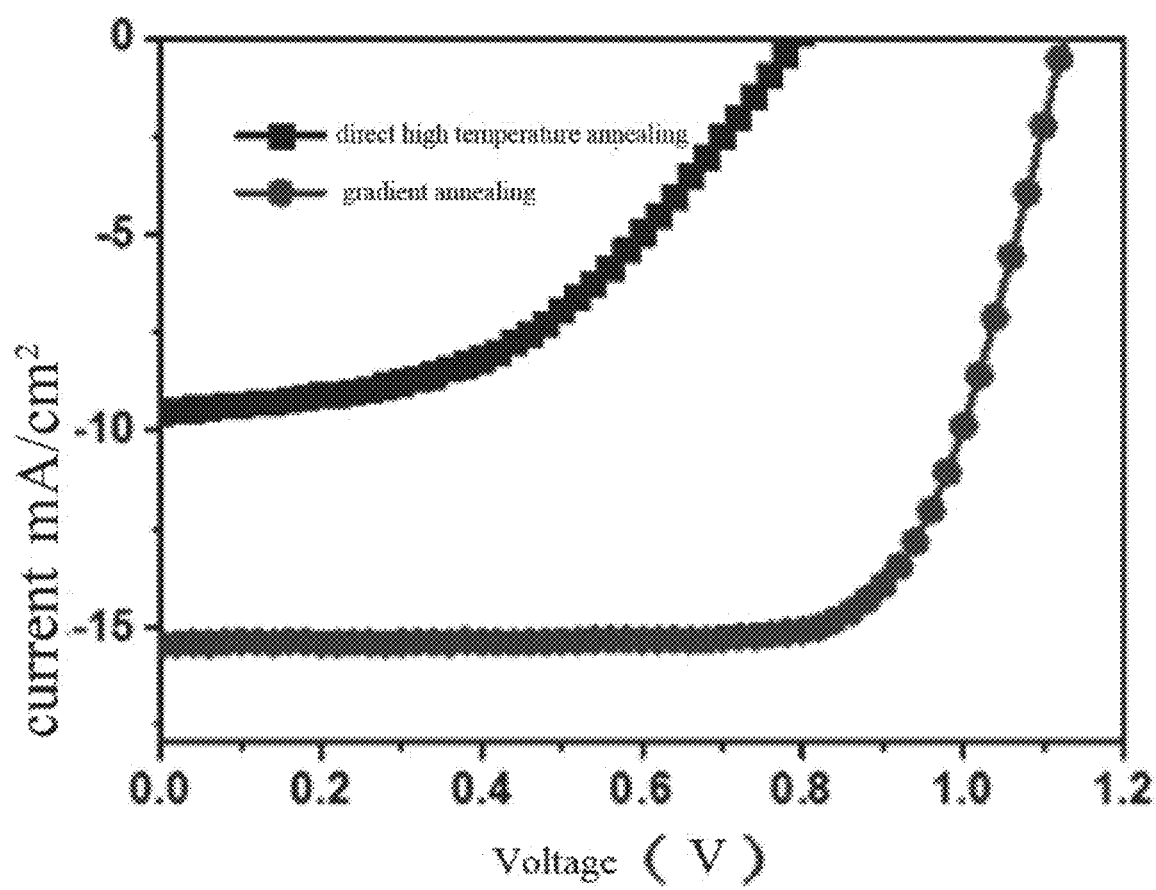
FIG. 4 is a J-V curve diagram of direct high temperature annealing and gradient annealing of a $CsPbI_2Br$ perovskite battery in Example 1.

FIG. 4 and Table 1 are the efficiency table and J-V curve chart of direct high temperature annealing (160° C./10 min) and gradient annealing of CsPbI$_2$Br perovskite battery. It can be seen that the film forming properties of the thin film directly annealed at a high temperature are extremely poor, so the performance parameters of the battery are not good, which is mainly due to the direct contact between the upper and lower transport layers caused by the poor film coverage of the perovskite. The performance of the gradient-annealed perovskite battery is superior, which is comparable to the highest efficiency of the inorganic perovskite battery reported; the PCE of the battery after direct high temperature annealing at 100° C. is 3.49%.

TABLE 1

Performance of inorganic perovskite batteries prepared by direct high temperature annealing and gradient annealing

| | $V_{oc}$ (V) | $J_{sc}$ (mA/Cm$^2$) | FF (%) | PCE (%) |
|---|---|---|---|---|
| Direct High Temperature Annealing | 0.79 | 7.28 | 46.1 | 3.49 |
| Gradient Annealing | 1.13 | 15.45 | 72.43 | 12.65 |

Example 2

Figure 5:
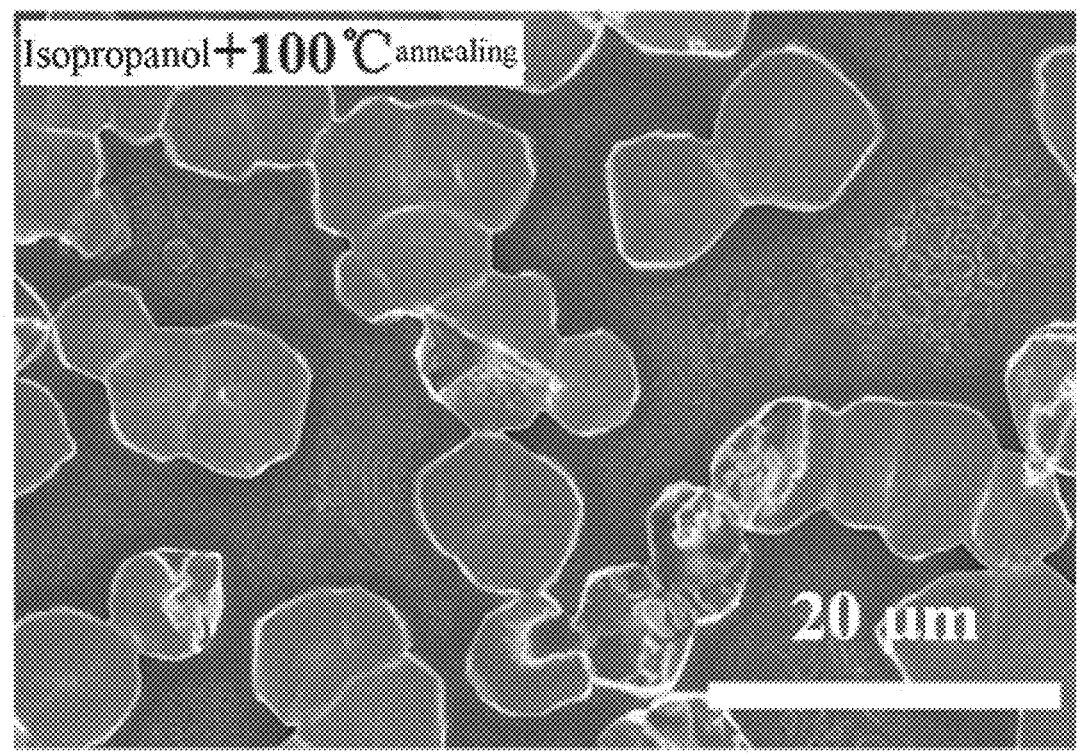
FIG. 5 is a SEM image of a high temperature annealing of a $CsPbI_2Br$ perovskite film in Example 2 after isopropanol treatment.

(1) A rigid substrate of glass was used for polishing, and then a layer of indium tin oxide film was plated on the glass by a magnetron sputtering method to form an ITO conductive glass as a cathode of a solar cell;

(2) Spin-coating TiO$_2$ solution on ITO conductive glass, 3000 rpm 30 s, and then annealing at 150° C. for 30 min to obtain an electron transport layer with a thickness of 20 nm;

(3) The ITO spin-coated with the electron transport layer was placed in a nitrogen glove box to spin-coat the perovskite precursor solution. The components of the precursor solution were PbI$_2$, CsI and PbBr$_2$, and the composition concentration was 1.3 M of CsPbI$_2$Br solution; the solvent was pure DMSO; the precursor solution was stirred for two hours and then filtered and used. The spin coating rate was 3000 rpm and the time was 30 s. When spin coating was performed for 20 s, 150 of isopropyl alcohol or toluene solution was added dropwise. After the spin coating was completed, gradient annealing was performed. The film was annealed at 50° C. for 1 minute, and then annealed at 100° C. for 1 minute, and finally annealed at 160° C. for 10 minutes to obtain an inorganic perovskite film. It is worth mentioning that if there is no gradient annealing process, the solution is annealed at 100° C. or higher directly after the antisolvent is added dropwise. The SEM image is shown in FIG. 5. The grains cannot completely cover the entire film, and the pores are large. This is similar to the SEM morphology of direct high temperature annealing without the addition of an anti-solvent. The PCE for preparing the battery was 5.73%. When 80° C./1 min+120° C./8 min was selected, the PCE of the battery was 6.83%; this further proves the importance of the gradient annealing of the present invention to the film quality.

Figure 6:
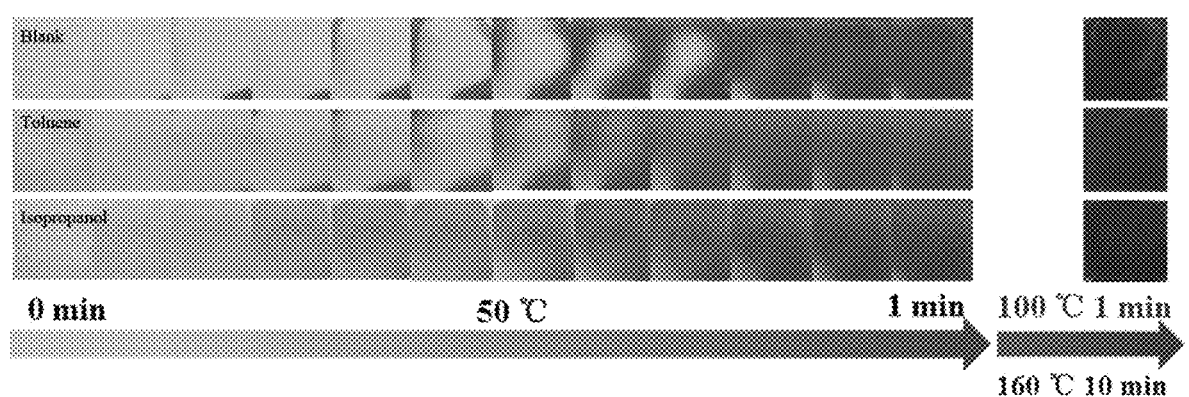
FIG. 6 is a color change diagram of gradient annealing of a $CsPbI_2Br$ perovskite layer in Example 2 after different antisolvent treatments.
Figure 7:
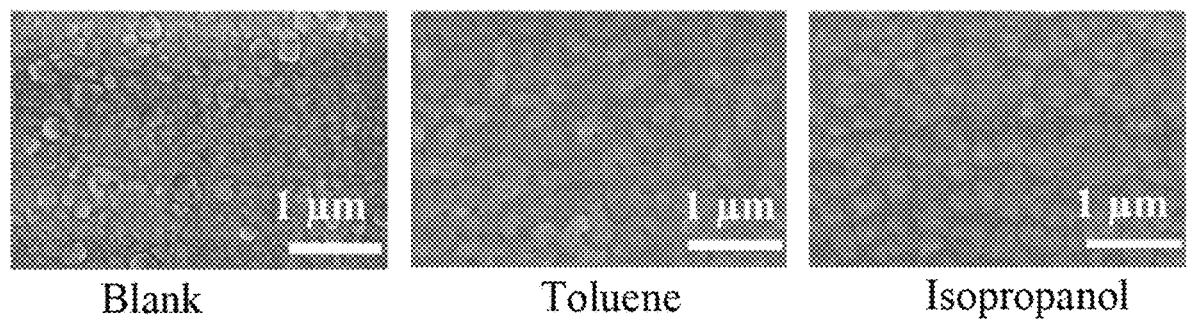
FIG. 7 is a SEM image of a $CsPbI_2Br$ film treated with different antisolvents in Example 2 after being annealed at 50° C. for 1 minute.
Figure 8:
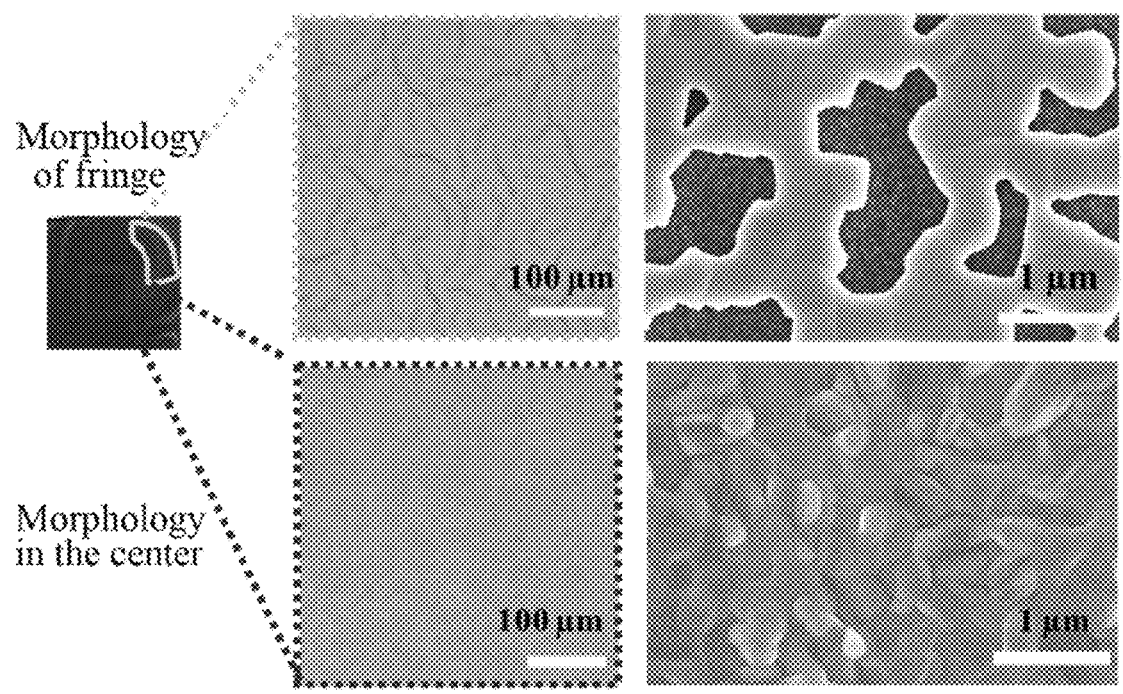
FIG. 8 is a comparison of an optical microscope image and a SEM image of a fringe $CsPbI_2Br$ perovskite thin film edge and a center in Example 2.

In situ characterization of films treated with different antisolvents is shown in FIG. 6. When annealing at 50° C. in the first stage of gradient annealing, compared with films not treated with antisolvent (blank), toluene or isopropyl alcohol (IPA) treated film is more uniform during crystallization; the SEM image also shows that the anti-solvent-treated film has a flatter film and larger grains after the first-stage annealing (FIG. 7); after the entire gradient annealing is completed, when anti-solvent is not added, the processed film has more stripes on the edges, which is mainly caused by uneven annealing of the film, and the optical microscope and SEM images at these stripes show more holes (FIG. 8). The influence is great. Compared to the center of the blank film, the optical microscope and SEM images show a denser film; and the film treated with toluene or isopropanol is more uniform during the first annealing (especially isopropanol). The resulting film has a smaller surface roughness, and the entire film is very uniform, and the edges have no white uneven stripes, which provides a guarantee for high-performance devices.

Figure 9:
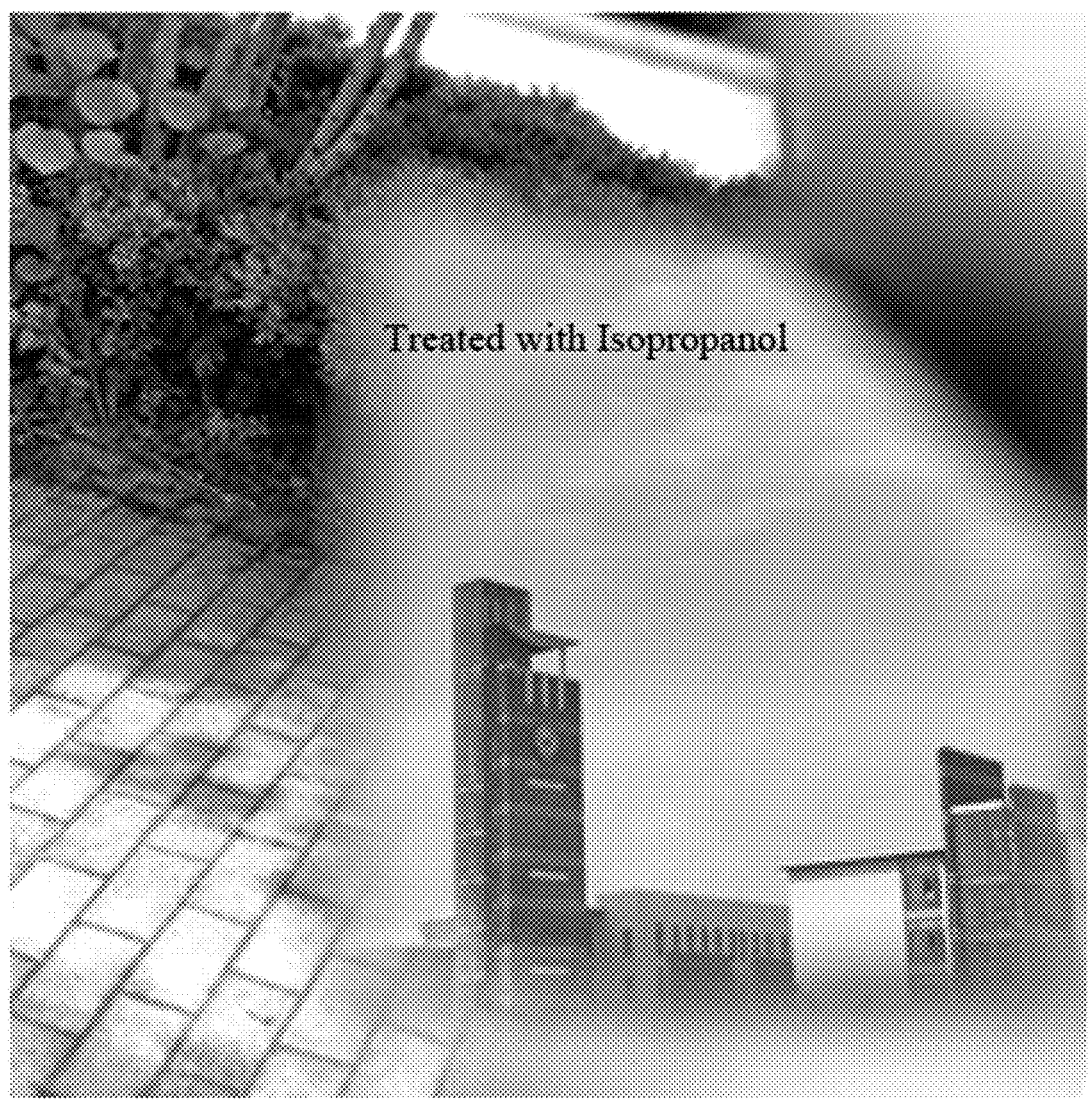
FIG. 9 is a photograph of specular reflection of a $CsPbI_2Br$ film treated with diisopropanol in Example 2.
Figure 10:
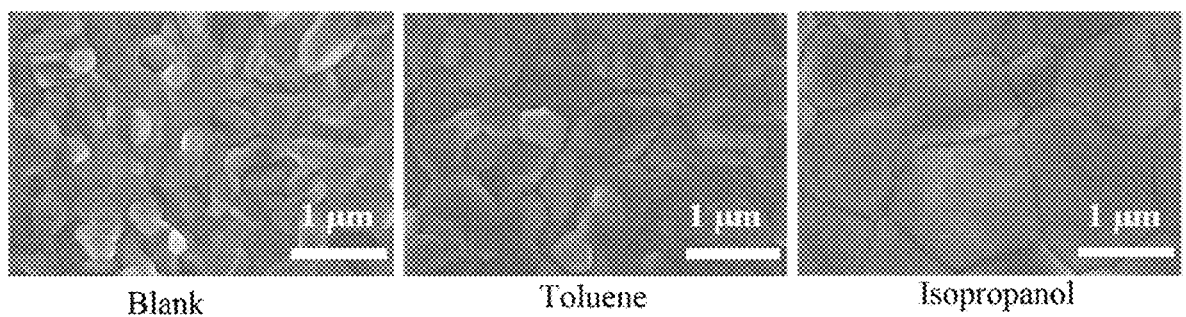
FIG. 10 is a SEM image of a $CsPbI_2Br$ film treated with different antisolvents in Example 2.
Figure 11:
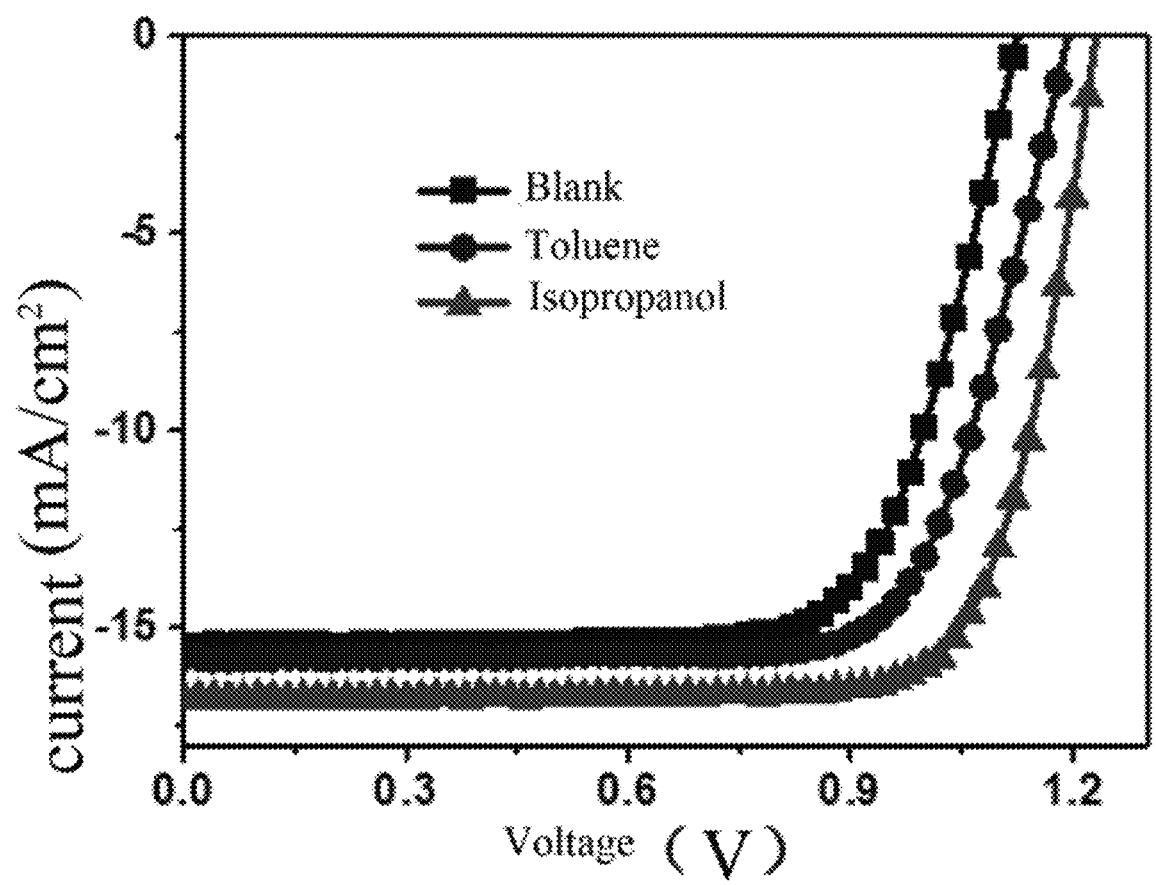
FIG. 11 is a J-V curve diagram of a $CsPbI_2Br$ device treated with different anti-solvents in Example 2.
Figure 12:
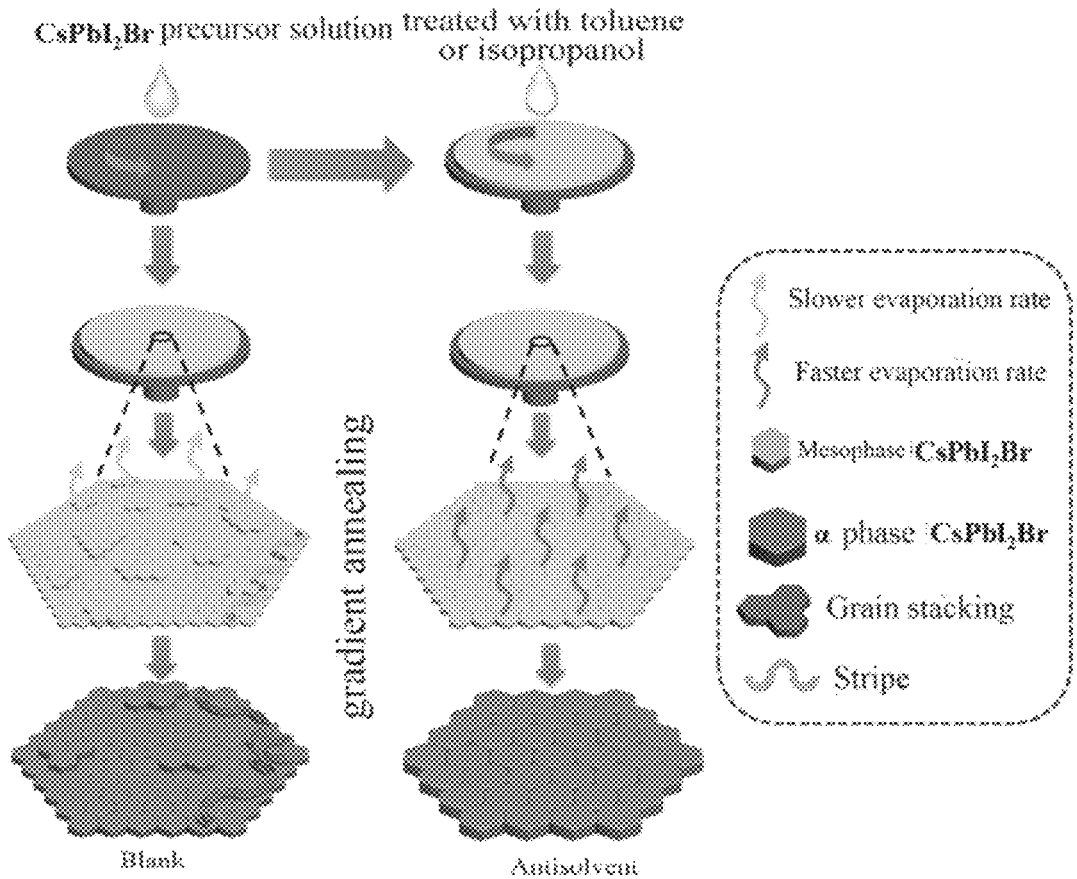
FIG. 12 is a simulation diagram of the synergistic effect of gradient annealing and antisolvent in Example 2.

FIG. 9 is an image of the specular reflection of the isopropanol-treated film, which fully illustrates the uniformity and flatness of the film; FIG. 10 is a SEM image of the film treated with different anti-solvents. Grade-sized grains are far superior to perovskite films without anti-solvent treatment or toluene treatment. This is also the reason for the excellent performance of isopropanol-treated devices. Related device parameters and JV curves are shown in Table 2 and FIG. 11. A simulated plot of gradient annealing and antisolvent synergy is shown in FIG. 12. It is shown that the present invention can use a high-concentration precursor solution and a high rotation speed to obtain a high-thickness, high-quality perovskite film, which overcomes the technical defects of the prior art that a thin film with a high thickness can be obtained at a low rotation speed and solves the problem. The existing perovskite film has many technical defects such as more pores and smaller grains, and has achieved unexpected technical effects.

(4) The perovskite film was placed on a vacuum chuck, and the Spiro-OMeTAD hole transport layer was spin-coated at a speed of 3000 rpm and 30 s, and oxidized in dry air for 12 hours to obtain a hole transport layer with a thickness of 150 nm;

(5) The oxidized hole-transport layer was placed in a coating machine to vapor-deposit an Au electrode with a thickness of 80 nm. At this point, the preparation of the CsPbI$_2$Br perovskite battery was completed. The structure of the device treated with different antisolvents is shown in FIG. 3. It can be seen from the figures that the thickness of the perovskite thin film reached 500 nm under three conditions, and the isopropanol-treated device thin film had fewer grain boundaries, which was beneficial to the improvement of performance.

Figure 13:
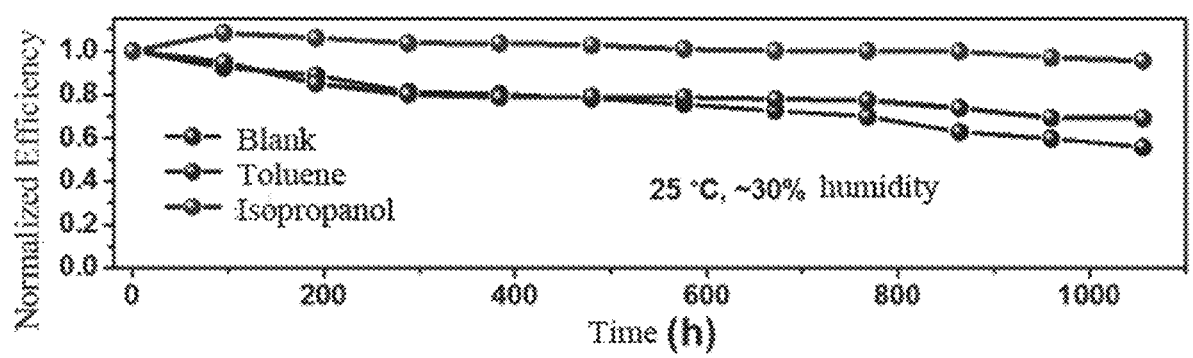
FIG. 13 shows the humidity stability of the $CsPbI_2Br$ device under the synergistic effect of gradient annealing and antisolvent in Example 2.

The crystal quality of the thin films treated with different anti-solvents is inconsistent, resulting in different device stability, as shown in FIG. 13. Stored at 25° C. and 30% humidity for 1000 hours, the IPA-treated device can maintain 95% of the initial efficiency, the toluene-treated device can maintain 70% of the initial efficiency, and the blank device efficiency decays to 56% of the initial efficiency. It can be seen that the quality of the crystal has a great impact on the stability of the device, and larger grains with fewer defect states help to suppress the degradation of the thin film itself, so that the device performance remains stable. In the present invention, during the preparation of the perovskite thin film, the concentration and composition of the precursor solution can be adjusted, and details are not described herein.

TABLE 2

Device performance with different antisolvent treatments

| | $V_{oc}$ (V) | $J_{sc}$ (mA/Cm$^2$) | FF (%) | PCE (%) |
|---|---|---|---|---|
| Blank | 1.13 | 15.45 | 72.43 | 12.65 |
| Toluene | 1.19 | 15.75 | 73.71 | 13.82 |
| Isopropanol | 1.23 | 16.79 | 77.81 | 16.07 |

The invention adopts gradient annealing and green antisolvent to treat the inorganic perovskite thin film to obtain a thin film with larger crystal grains, higher purity and better stability. The inorganic perovskite film prepared by this method has good thermal stability, does not degrade at high temperature, and has good stability at lower humidity; and the efficiency of the inorganic perovskite battery prepared by this method It has exceeded 16% and is the highest efficiency in the field of inorganic perovskite.

The invention claimed is:

1. A method for preparing an inorganic perovskite battery based on a synergistic effect of gradient annealing and antisolvent, comprising preparing a perovskite layer by a gradient annealing and an antisolvent treatment,
wherein a thickness of the perovskite layer is 100 to 1000 nm; when preparing a perovskite precursor solution of the perovskite layer, a solvent is an amide-based solvent and/or a sulfone-based solvent; a concentration of the perovskite precursor solution for preparing the perovskite layer is 0.4 to 2 M; and the gradient annealing is conducted at 50° C. for 1 min, 100° C. for 1 min, and 160° C. for 10 min; and a solvent for the antisolvent treatment is isopropanol.

2. The method for preparing an inorganic perovskite battery based on the synergistic effect of gradient annealing and antisolvent according to claim 1, comprising the following steps:
(1) preparing a cathode on a transparent substrate;
(2) preparing an electron transport layer on the cathode;
(3) preparing the perovskite layer on the electron transport layer by the gradient annealing and the anti-solvent treatment;
(4) preparing a hole transporting layer on the perovskite layer;
(5) preparing an electrode on the hole transport layer to obtain a perovskite solar cell;
or
(1) preparing an anode on the transparent substrate;
(2) preparing a hole transport layer on the anode;
(3) preparing the perovskite layer on the hole transport layer by the gradient annealing and the anti-solvent treatment;
(4) preparing an electron transport layer on the perovskite layer;
(5) preparing an electrode on the electron transport layer to obtain a perovskite solar cell.

3. The method according to claim 2, wherein the transparent substrate is a glass substrate, a quartz substrate, a PET plastic substrate, a PEN plastic substrate, or a flexible grid silver substrate; the cathode is indium tin oxide or fluorine-doped tin dioxide; the anode is indium tin oxide or fluorine-doped tin dioxide; the electron transport layer is ZnO, TiO$_2$, SnO$_2$, PCBM, fullerene, or a fullerene derivative; the hole transport layer is selected from the group consisting of poly[bis(4-phenyl)(2,4,6-trimethylphenyl)amine], poly3,4-ethylenedioxythiophene/polystyrene sulfonate, nickel oxide, copper oxide, 2,2',7,7'-tetra[N,N-bis(4-methoxyphenyl)amino]-9,9'-spirobi-fluorene, cuprous thiocyanate, and molybdenum oxide.

4. The method according to claim 2, wherein the electrode is one or more selected from the group consisting of an Au electrode, an Ag electrode, an Al electrode, a cu electrode, a carbon electrode, a PH1000 polymer electrode, and a metal oxide electrode.

5. An inorganic perovskite battery prepared according to the method of claim 1.

* * * * *